(12) United States Patent
Baba et al.

(10) Patent No.: US 6,853,054 B2
(45) Date of Patent: Feb. 8, 2005

(54) HIGH FREQUENCY SEMICONDUCTOR DEVICE

(75) Inventors: Osamu Baba, Yamanashi (JP); Yutaka Mimino, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/078,346

(22) Filed: Feb. 21, 2002

(65) Prior Publication Data

US 2002/0140057 A1 Oct. 3, 2002

(30) Foreign Application Priority Data

Mar. 30, 2001 (JP) ........................................ 2001-099954

(51) Int. Cl.[7] ............................................. H01L 23/58
(52) U.S. Cl. ................... 257/635; 257/636; 257/637; 257/758; 257/759; 257/665; 257/662; 257/664
(58) Field of Search .................................. 257/211, 758, 257/759, 760, 761, 635, 636, 637, 638, 662, 664, 728, 259, 275, 276; 438/118, 167, 186, 622, 623, 624, 724, 759, 769, 761; 333/104, 161, 204, 238, 246

(56) References Cited

U.S. PATENT DOCUMENTS

| | | | | |
|---|---|---|---|---|
| 5,049,978 A | * | 9/1991 | Bates et al. | 257/686 |
| 5,184,095 A | * | 2/1993 | Hanz et al. | 320/107 |
| 5,396,397 A | * | 3/1995 | McClanahan et al. | 361/313 |
| 5,413,962 A | * | 5/1995 | Lur et al. | 438/169 |
| 5,496,743 A | * | 3/1996 | Luryi | 438/118 |
| 5,631,478 A | * | 5/1997 | Okumura | 257/211 |
| 5,721,453 A | * | 2/1998 | Imai et al. | 257/700 |
| 5,952,709 A | * | 9/1999 | Kitazawa et al. | 257/664 |
| 6,100,589 A | * | 8/2000 | Tanaka | 257/758 |
| 6,170,154 B1 | * | 1/2001 | Swarup | 29/830 |
| 6,403,463 B1 | * | 6/2002 | Suyama | 438/622 |
| 6,535,398 B1 | * | 3/2003 | Moresco | 257/700 |
| 2001/0008309 A1 | * | 7/2001 | Iijima et al. | 257/737 |

FOREIGN PATENT DOCUMENTS

| | | |
|---|---|---|
| JP | 64-005057 | 1/1989 |
| JP | 5-047943 | 2/1993 |
| JP | 5-109913 | 4/1993 |

OTHER PUBLICATIONS

Aiikawa Masayoshi et al; "Monolithic microwave integrated circuit", p. 231, 1997.
Copy of Taiwanese Patent Office Action for corresponding Taiwanese Patent Application No. 91104614 dated May 9, 2003 with partial translation.
Copy of Japanese Patent Office Communication for corresponding Japanese Patent Application No. 2001–099954 dated May 20, 2003 with partial translation.

* cited by examiner

Primary Examiner—Eddie Lee
Assistant Examiner—Quang Vu
(74) Attorney, Agent, or Firm—Armstrong, Kratz, Quintos, Hanson & Brooks, LLP

(57) ABSTRACT

A high frequency semiconductor device including wiring layers which are formed above a semiconductor substrate and in which transmission lines are formed by combining with a ground plate having a potential fixed at the ground potential, at least one crossing portion in which the wiring layers mutually cross, with insulating interlayers provided therebetween, and at least one separation electrode being selectively provided on one of the insulating interlayers, the at least one separation electrode having a potential fixed at the ground potential. Accordingly, in the high frequency semiconductor device, electrical interference between two crossing wiring layer is prevented and transmission loss is suppressed.

10 Claims, 5 Drawing Sheets

HIGH FREQUENCY SEMICONDUCTOR DEVICE

BACKGROUND OF THE INVENTION

1. Field of the Invention

The present invention relates to high frequency semiconductor devices, and in particular, to a multilayer wiring structure for monolithic microwave integrated circuit (MMIC) for use in the gigahertz or higher frequency spectrum.

2. Description of the Related Art

In an MMIC in which high speed semiconductors such as high-electron-mobility transistors (HEMTs) and heterobipolar transistors (HBTs) are integrated with passive devices such as capacitors and resistors, microstrip transmission lines which have superior signal transmission characteristics in high frequency region are generally used for transmitting signals among devices. For increasing the integration density of the MMIC, the transmission lines are normally multilayered.

FIGS. 1A and 1B show the structure of an MMIC according to the related art. FIG. 1A shows a plan view of the MMIC, and FIG. 1B shows a cross-sectional view taken along the line IB—IB in FIG. 1A. As shown in FIG. 1B, an active device 2 such as an HEMT and a passive device 3 such as a capacitor or a resistor are formed on a surface of a gallium arsenide (GaAs) substrate 1. The devices 2 and 3 are covered with a surface insulating layer 4, and a ground plate 5 is formed thereon which has a potential fixed to the ground potential. Insulating interlayers and wiring layers are alternately stacked on the ground plate 5, in accordance with the required level number of wiring layers.

Specifically, FIG. 1B shows a three-layer wiring structure in which wiring layers 51, 53, and 55 are alternatively stacked, with insulating interlayers 50, 52, and 54 provided therebetween. Each of the wiring layers 51, 53, and 55 combines with the ground plate 5 to form a transmission line. The connection between two wiring layers and the connection between each wiring layer and each device are established by through-holes (not shown), as required.

In the MMIC having the above multilayered structure, two wiring layers may cross each other as a result of circuit arrangement. As shown in FIGS. 1A and 1B, the wiring layer 51 as a first level crosses the wiring layer 53 as a second level, with the insulating interlayer 52 provided therebetween. The wiring layer 51 as the first level also crosses the wiring layers 55 as a third level, with the insulating interlayers 52 and 54 provided therebetween.

When two wiring layers cross each other, as described above, the transmission characteristics deteriorate, for example, signal leakage may occur, because signals transmitted by transmission lines made of wiring layers mutually interfere where they cross one another. To prevent the deterioration, a method is employed in which, by forming an insulating interlayer between upper and lower wiring layers which cross each other, and providing a separation plate on the insulating interlayer, the wiring layers are electrically separated.

FIG. 2 shows a cross-sectional view of an improved multilayered wiring structure for MMICs. This structure has an additional insulating interlayer 56 inserted among wiring layers 51 and 53 which cross each other. The insulating interlayer 56 has a separation plate 57 provided on the entirety thereof. The wiring layer 51 as a first level combines with a ground plate 5 to form a microstrip transmission line. Similarly, both the wiring layer 53 as a second level and the wiring layers 55 as a third level combine with the separation plate 57 to form transmission lines. This arrangement electrically separates crossing transmission lines made of the wiring layers 51, 53, and 55.

Although the multilayered wiring structure shown in FIG. 2 is effective in preventing interference among transmission lines where they cross each other, the insulating interlayer 56 for providing the separation plate 57 must be inserted. This causes a problem in that the number of insulating interlayers increases, thus increasing the thickness of the overall multilayered wiring structure.

The connection between two wiring layers and the connection between each wiring layer and each semiconductor device are established by throughholes in accordance with the circuit design requirements. When the top wiring layer is connected to the semiconductor device, throughholes which penetrate all stacked insulating interlayers must be formed. However, as described above, when the total thickness of the multilayered wiring structure is increased due to the increased number of insulating interlayers, it is difficult for the production process to form minute throughholes.

Accordingly, when the increase in the total thickness is reduced by reducing the thicknesses of the insulating interlayers, the characteristic impedance of the transmission lines which have the insulating interlayers therebetween decrease, resulting in deterioration in the transmission characteristics. To avoid this problem, if the transmission characteristics of the transmission lines is maintained at a predetermined value, the width of each wiring layer must be reduced, resulting in the problem of the increased transmission loss.

SUMMARY OF THE INVENTION

It is an object of the present invention to provide a high frequency semiconductor device in which electrical interference between crossing wiring layers is prevented and transmission loss is suppressed.

To this end, according to the present invention, the above object is achieved through provision of a multilayered wiring structure for high frequency semiconductor devices which includes a semiconductor substrate a ground plate which is formed above said semiconductor substrate and which have a potential fixed at the ground potential, a plurality of wiring layers each of which is alternately stacked with insulating interlayer above the semiconductor substrate and combines with the ground plate to form transmission lines, and at least one separation electrode which is selectively provided on the additional insulating interlayer and which has a potential fixed at the ground potential. The multilayered wiring structure has at least one crossing portion where the wiring layers mutually cross, with insulating interlayers provided therebetween.

Preferably, the length and width of dimensions of at least one separation electrode is sufficiently smaller than the length of each of the transmission lines above the semiconductor substrate so as to not significantly interfere with transmission line characteristics of the wiring layers.

Each of the crossing portions may have an individual separation electrode.

The separation electrodes may be electrically directly interconnected.

The separation electrodes may have a potential which is fixed at the ground potential by a common electrode.

The separation electrodes may be provided on one of the insulating interlayers, and may be electrically interconnected by wiring extended on the insulating interlayer.

The separation electrodes may be provided on different insulating interlayers, and may be electrically and directly interconnected by at least one through-holes.

A single separation electrode may be provided for all of the crossing portions.

The crossing portions may be positioned at different levels, and the separation electrodes may be provided on those of the insulating interlayers which are provided for all of the crossing portions.

The crossing portions may be positioned at different levels, and the single separation electrode may be provided on one of the insulating interlayers which is provided for all of the crossing portions.

In the present invention, crossing wiring layers are electrically separated by the separation electrode which is selectively provided in a crossing portion. Thus, they cannot mutually interfere. Above a semiconductor substrate, in portions other than the crossing portion, the wiring layers combine with a ground plate to form ordinary transmission lines, so that transmission loss is not increased, compared with a case in which the wiring layers do not cross. Therefore, by sufficiently reducing one of the length and width of the separation electrode to be less than the length of each transmission line, the total transmission loss of all the transmission lines can be reduced compared to the cases in the relate art.

According to the present invention, by selectively providing at least one separation electrode in a portion in which transmission lines cross each other, the interference among the transmission lines can be prevented and transmission loss can be minimized. This is an advantage in improvement of the characteristics of a high frequency semiconductor device having a multilayered wiring structure.

DESCRIPTION OF THE PREFERRED EMBODIMENTS

Embodiments of the present invention are described below with reference to the accompanying drawings.

Figure 3A:
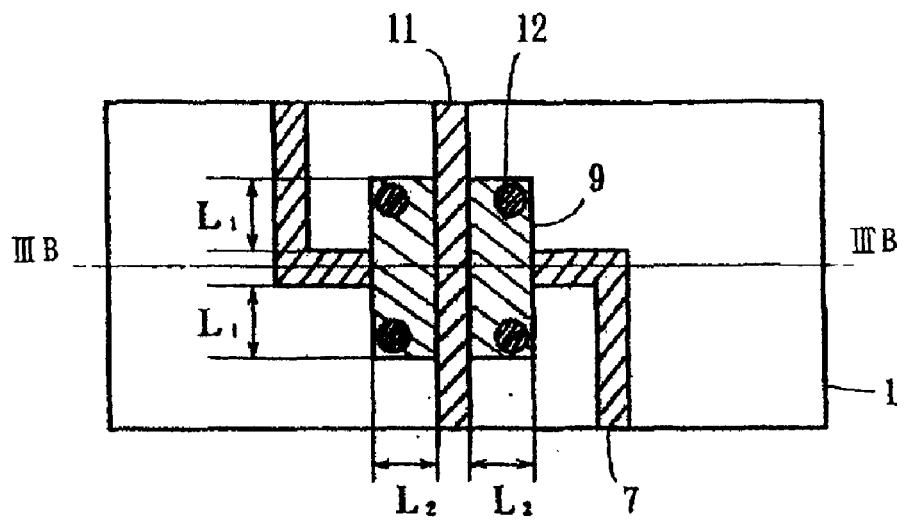
FIG. 3A is a plan view of an MMIC according to an embodiment of the present invention.
Figure 3B:
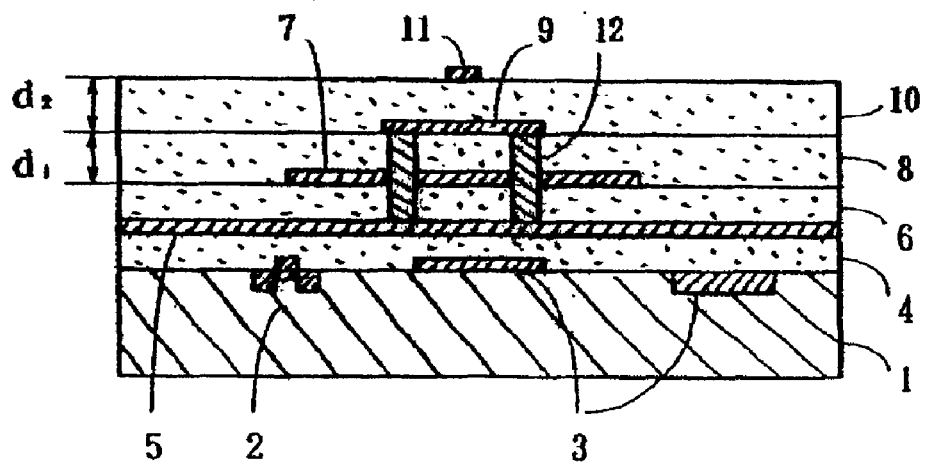
FIG. 3B is a cross-sectional view taken along the line IIIB—IIIB in FIG. 3A.

FIG. 3A shows a plan view of an MMIC according to an embodiment of the present invention, and FIG. 3B shows a cross-sectional view taken along the line IIIB—IIIB in FIG. 3A. The MMIC has an active device 2 such as an HEMT and passive devices 3 such as a metal-insulator-metal (MIM) capacitor and a resistor which are formed on a GaAs substrate 1. A surface insulating layer 4 for protection from the external atmosphere is formed on the devices 2 and 3. A stable material such as silicon nitride is used as the surface insulating layer 4. A ground plate 5 having a potential fixed to the ground potential is formed on the surface insulating layer 4. A first level insulating interlayer 6, a first level wiring layer 7, a second level insulating interlayer 8, a separation electrode 9, a third level insulating interlayer 10, and a second level wiring layer 11 are formed above the ground plate 5.

Low dielectric organic resin such as polyimide is used as the material for the insulating interlayers 6, 8, and 10. Conductive material such as gold is used as the material for the ground plate 5, the wiring layers 7 and 11, and the separation electrode 9. The separation electrode 9 is connected to the ground plate 5 by throughholes 12.

As shown in FIGS. 3A and 3B, in a crossing portion in which the wiring layers 7 and 11 cross each other, the separation electrode 9 is selectively provided between the insulating interlayers 8 and 10. The separation electrode 9 has a function of preventing electrical interference between the wiring layers 7 and 11. In portions other than the crossing portion, the wiring layers 7 and 11 combine with the ground plate 5 to form transmission lines.

It is known that the transverse spreading range of a signal transmitted on a microstrip transmission line is approximately three times the distance between the electrodes composed of the transmission line. Accordingly, to prevent electrical interference between two transmission lines where they cross each other, the following settings should be employed:

$$L_1 \leq 3 \times d_1$$

$$L_2 \leq 3 \times d_2$$

where $d_1$ and $d_2$ represent the thicknesses of the insulating interlayers 8 and 10, respectively, $L_1$ represents the length by which the separation electrode 9 extends over the width of the wiring layer 7, and $L_2$ represents the length by which the separation electrode 9 extends over width of the wiring layer 11.

The thicknesses $d_1$ and $d_2$ of the insulating interlayers 8 and 10 are sufficiently smaller than the lengths in the signal transmission direction of the wiring layers 7 and 11. Thus, the size of the separation electrode 9 which is determined by $L_1$ and $L_2$ is such that it can be ignored compared with the lengths of the wiring layers 7 and 11. Accordingly, in most portions other than the crossing portion, the wiring layers 7 and 11 combine with the ground plate 5 to form transmission lines, whereby the transmission loss of the transmission lines can be reduced compared with the related art.

In other words, the wiring layers 7 and 11 do not interfere with each other because they are electrically separated in the crossing portion by the separation electrode 9, and the transmission characteristics of the transmission lines respectively formed of the wiring layers 7 and 11 deteriorate within an extremely limited portion determined by the size of the separation electrode 9. Thus, transmission characteristic deterioration and transmission loss can be suppressed to such an extent they can be ignored.

The first embodiment has described an MMIC which has a two-layer wiring structure and one crossing portion. However, even in a case having an increasing level number of wiring layers and a plurality of crossing portions, by disposing at least one separation electrode, as described below, advantages similar to those in the first embodiment can be obtained.

Figure 1A:
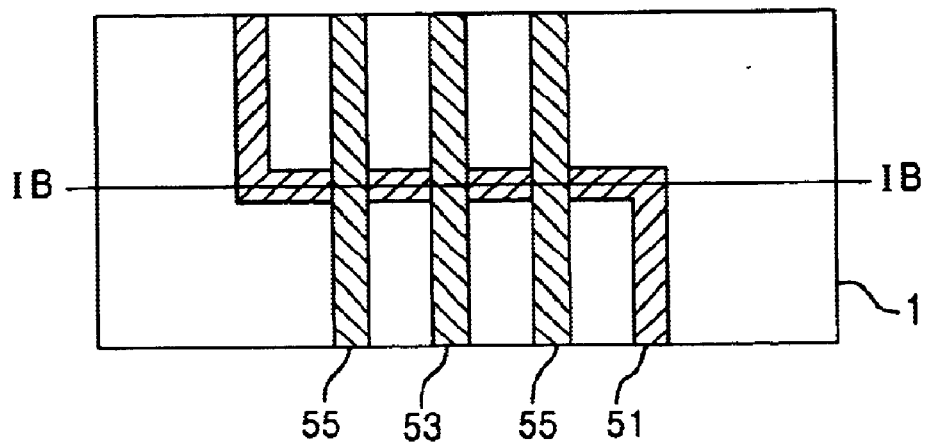
FIG. 1A is a plan view of an MMIC according to the related art.
Figure 1B:
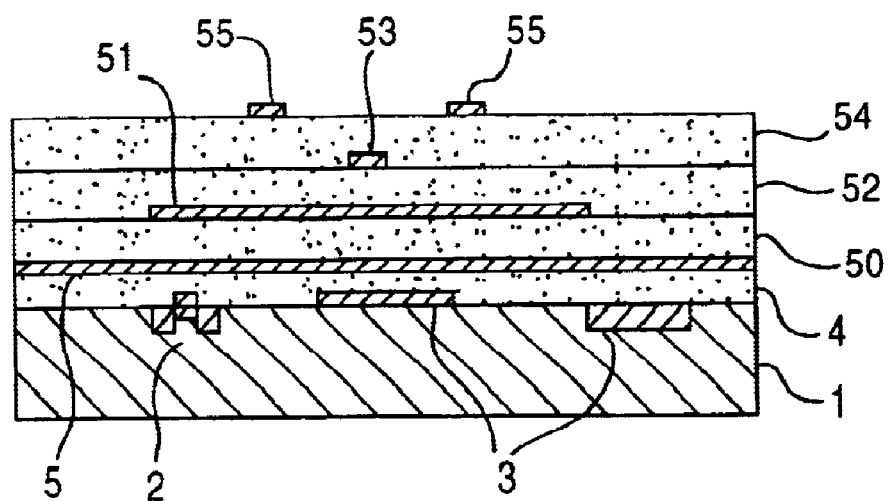
FIG. 1B is a cross-sectional view taken along the line IB—IB of FIG. 1A.
Figure 2:
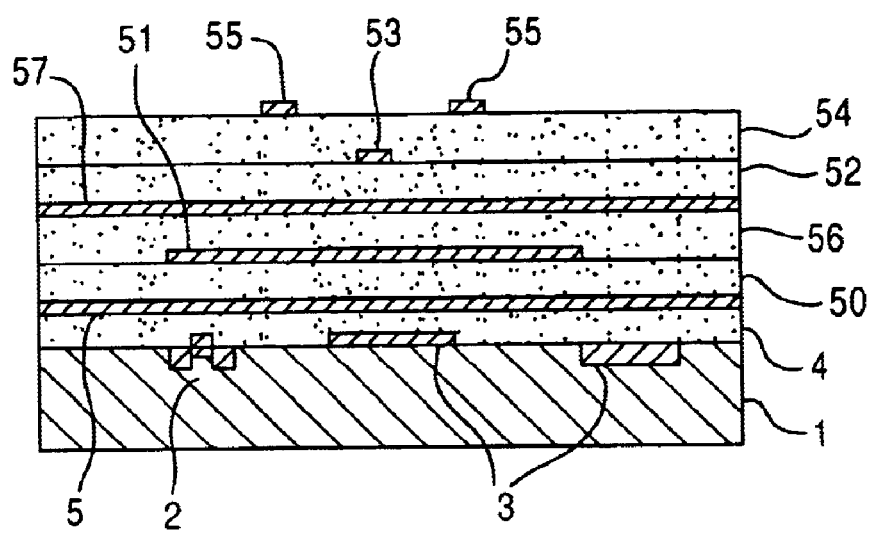
FIG. 2 is a cross-sectional view of another MMIC according to the related art.
Figure 4:
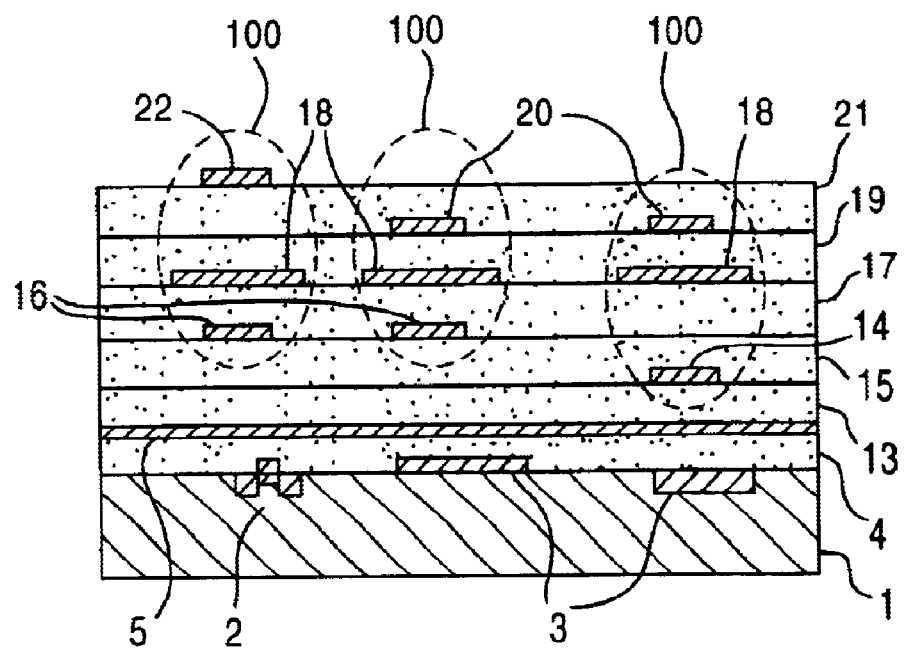
FIG. 4 is a cross-sectional view of an MMIC according to the embodiment of the present invention.
Figure 5:
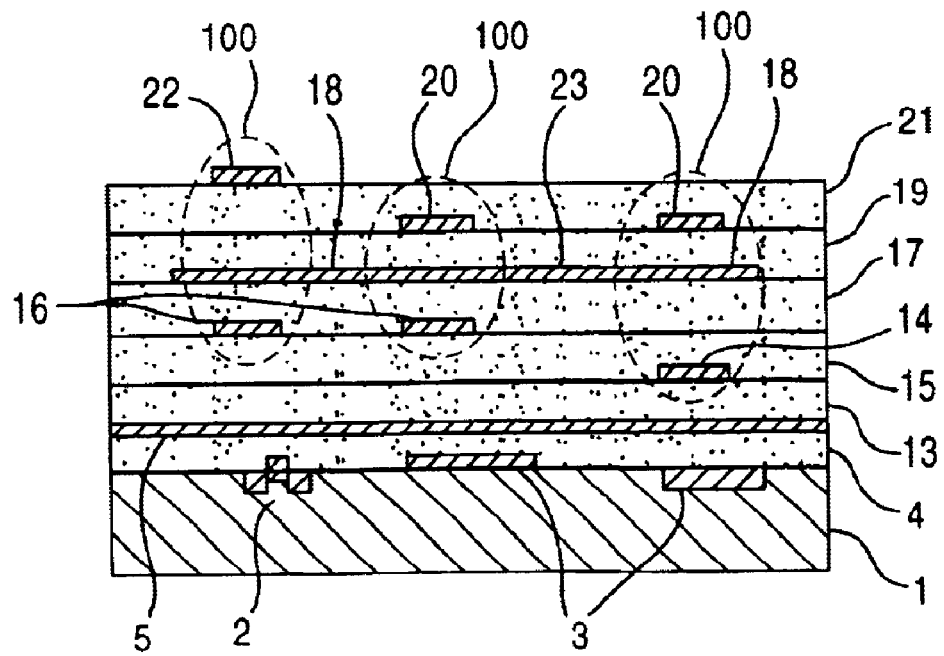
FIG. 5 is a cross-sectional view of an MMIC according to another embodiment of the present invention.
Figure 6:
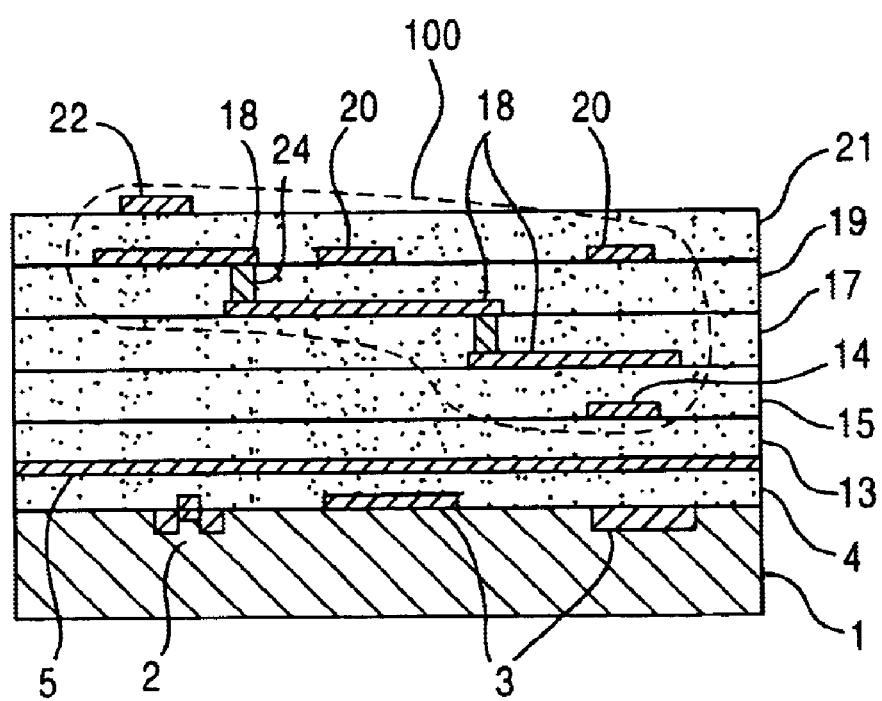
FIG. 6 is a cross-sectional view of an MMIC according to another embodiment of the present invention.

FIGS. 4 to 6 show sections of other embodiments of the present invention and other arrangements of separation electrodes. In FIGS. 4 to 6, parts identical to those shown in FIGS. 1A and 1B are denoted by identical reference numerals. The other embodiments each include insulating interlayers 13, 15, 17, 19, and 21, wiring layers 14, 16, 20, and 22, and separation electrodes 18.

FIG. 4 shows a case in which the wiring layers 14, 16, 20, and 22 cross above a GaAs substrate 1 in a plurality of portions, with the insulating interlayers 13, 15, 17, 19, and 21 provided therebetween. In each of the crossing portions 100, each separation electrode 18 is provided. By electrically interconnecting these separation electrodes 18, and fixing their potential to a predetermined potential, for example, the ground potential, the transmission characteristics can be further stabilized.

FIG. 5 shows a case in which a plurality of crossing portions 100 are divided into a plurality of groups which are close to each other above a GaAs substrate 1. In this case, a common separation electrode is provided for wiring layers belonging to a single group, and other common separation electrodes are provided for pluralities of wiring layers which belong to other groups. As described above, by using wiring layer 23 to interconnect the separation electrodes 18, their potential may be fixed to the ground potential.

In addition, as shown in FIG. 6, in a case in which a plurality of crossing portions 100 are formed on different insulating interlayers 13, 15, 17, 19, and 21, respectively, each separation electrode 18 is provided on each insulating interlayer, and the separation electrodes 18 are electrically connected by through-holes which penetrate the insulating interlayers 17 and 19.

What is claimed is:

1. A multilayered wiring structure for high frequency semiconductor devices, comprising:

a semiconductor substrate;

a ground plate formed above said semiconductor substrate, having a potential fixed at the ground potential;

a plurality of wiring layers, each of which is alternately stacked with an insulating interlayer formed above said semiconductor substrate, the wiring layers combining with said ground plate to form transmission lines; and at least one separation plate being stacked between the wiring layers which mutually cross, with insulating interlayers formed therebetween, said at least one separation plate having a potential fixed at the ground potential, wherein said at least one separation plate is selectively provided at a crossing portion where the wiring layers mutually cross, said multilayered wiring structure further including additional crossing portions where the wiring layers mutually cross, wherein each of the crossing portions has an individual separation plate, wherein the separation plate are electrically interconnected, and wherein the separation plates are provided on different insulating interlayers, and are electrically interconnected by at least one through-hole.

2. A multilayered wiring structure for high frequency semiconductor devices according to claim 1, wherein the length and width dimensions of said at least one separation plate are sufficiently smaller than the length of each of the wiring layers used in forming the transmission lines above said semiconductor substrate so as to not significantly interfere with transmission line characteristics of the wiring layers.

3. A multilayered wiring structure for high frequency semiconductor devices according to claim 1, wherein the separation plates have a potential which is fixed at the ground potential by one of the wiring layers acting as a common electrode.

4. A multilayered wiring structure for high frequency semiconductor devices according to claim 1, wherein the separation plates are provided on one of the insulating interlayers, and are electrically interconnected by wiring extended on said insulating interlayer.

5. A multilayered wiring structure for high frequency semiconductor devices comprising:

a semiconductor substrate;

a ground plate formed above said semiconductor substrate, having a potential fixed at the ground potential;

a plurality of wiring layers, each of which is alternately stacked with an insulating interlayer formed above said semiconductor substrate, the wiring layers combining with said ground plate to form transmission lines; and at least one separation plate being stacked between the wiring layers which mutually cross, with insulating interlayers formed therebetween, said at least one separation plate having a potential fixed at the ground potential, wherein said at least one separation plate is selectively provided at a crossing portion where the wiring layers mutually cross, said multilayered wiring structure further including additional crossing portions where the wiring layers mutually cross, wherein each of the crossing portions has an individual separation plate, and wherein the crossing portions are positioned at different levels, and the separation plates are provided on those of the insulating interlayers which are provided for all of the crossing portions.

6. A multilayered wiring structure for high frequency semiconductor devices, according to claim 5, wherein the length and width dimensions of said at least one separation plate are sufficiently smaller than the length of each of the wiring layers used in forming the transmission lines above said semiconductor substrate so as to not significantly interfere with transmission line characteristics of the wiring layers.

7. A multilayered wiring structure for high frequency semiconductor devices according to claim 5, wherein the separation plates have a potential which is fixed at the ground potential by one of the wiring layers acting as a common electrode.

8. A multilayered wiring structure for high frequency semiconductor devices according to claim 5, wherein the separation plates are provided on one of the insulating interlayers, and are electrically interconnected by wiring extended on said insulating interlayer.

9. A multilayered wiring structure for high frequency semiconductor devices comprising:

a semiconductor substrate;

a ground plate formed above said semiconductor substrate, having a potential fixed at the ground potential;

a plurality of wiring layers, each of which is alternately stacked with an insulating interlayer formed above said semiconductor substrate, the wiring layers combining with said ground plate to form transmission lines; and at least one separation plate being stacked between the wiring layers which mutually cross, with insulating interlayers formed therebetween, said at least one separation plate having a potential fixed at the ground potential, wherein said at least one separation plate is selectively provided at a crossing portion where the wiring layers mutually cross, wherein a single separation plate is provided for all of the crossing portions, and wherein the crossing portions are positioned at different levels, and said single separation plate is provided on one of the insulating interlayers which is provided for all of the crossing portions.

10. A multilayered wiring structure for high frequency semiconductor devices, according to claim 9, wherein the length and width dimensions of said at least one separation plate are sufficiently smaller than the length of each of the wiring layers used in forming the transmission lines above said semiconductor substrate so as to not significantly interfere with transmission line characteristics of the wiring layers.

* * * * *